United States Patent
Cha et al.

(10) Patent No.: US 12,278,171 B2
(45) Date of Patent: Apr. 15, 2025

(54) CHIP PACKAGE AND METHOD OF FORMING A CHIP PACKAGE

(71) Applicant: Infineon Technologies AG, Neubiberg (DE)

(72) Inventors: Chan Lam Cha, Jasin (MY); Wern Ken Daryl Wee, Melaka (MY); Hoe Jian Chong, Melaka (MY); Chin Kee Leow, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/084,604

(22) Filed: Dec. 20, 2022

(65) Prior Publication Data
US 2023/0197586 A1    Jun. 22, 2023

Related U.S. Application Data

(63) Continuation-in-part of application No. 17/556,341, filed on Dec. 20, 2021.

(30) Foreign Application Priority Data

Feb. 11, 2022  (DE) .................. 102022103210.8

(51) Int. Cl.
*H01L 23/495*  (2006.01)
*H01L 21/56*   (2006.01)
(Continued)

(52) U.S. Cl.
CPC ........ *H01L 23/49575* (2013.01); *H01L 21/56* (2013.01); *H01L 24/19* (2013.01);
(Continued)

(58) Field of Classification Search
CPC ............ H01L 23/495; H01L 23/49551; H01L 23/49575
(Continued)

(56) References Cited

U.S. PATENT DOCUMENTS 5,989,939 A * 11/1999 Fjelstad .................. H01L 24/13
                                                            438/117
6,268,662 B1 * 7/2001 Test ........................ H01L 24/11
                                                            257/784

(Continued)

FOREIGN PATENT DOCUMENTS

DE          10110005 B4    11/2007
DE      112007000781 T5     1/2009
(Continued)

*Primary Examiner* — Nitin Parekh
(74) *Attorney, Agent, or Firm* — Murphy, Bilak & Homiller, PLLC

(57) ABSTRACT

A chip package includes a chip with at least one contact pad, a contact structure formed from at least one continuous longitudinally extended electrically conductive element by attaching the conductive element to the contact pad in at least three contact positions, wherein the conductive element bends away from the contact pad between pairs of consecutive contact positions, and an encapsulation partially encapsulating the contact structure, wherein the encapsulation includes an outer surface facing away from the chip, and wherein the contact structure is partially exposed at the outer surface.

17 Claims, 9 Drawing Sheets

(51) Int. Cl.
*H01L 23/00* (2006.01)
*H01L 25/00* (2006.01)
*H01L 25/065* (2023.01)

(52) U.S. Cl.
CPC .......... *H01L 24/20* (2013.01); *H01L 25/0655* (2013.01); *H01L 25/50* (2013.01); *H01L 2224/211* (2013.01)

(58) Field of Classification Search
USPC ........................................ 257/666, 787, 784
See application file for complete search history.

(56) References Cited

U.S. PATENT DOCUMENTS

| | | | |
|---|---|---|---|
| 6,778,406 B2 * | 8/2004 | Eldridge | H01L 22/20 257/E21.507 |
| 7,032,311 B2 * | 4/2006 | Razon | H01L 24/85 29/874 |
| 7,276,783 B2 | 10/2007 | Goller et al. | |
| 7,989,949 B2 * | 8/2011 | Gupta | H01L 23/3677 257/784 |
| 8,318,541 B2 | 11/2012 | Shin et al. | |
| 9,147,649 B2 | 9/2015 | Landau et al. | |
| 9,583,436 B2 | 2/2017 | Tseng et al. | |
| 10,418,313 B2 | 9/2019 | Fuergut et al. | |
| 10,796,981 B1 | 10/2020 | Chiang et al. | |
| 2004/0009343 A1 | 1/2004 | Igarashi et al. | |
| 2007/0284720 A1 | 12/2007 | Otremba et al. | |
| 2008/0014678 A1 * | 1/2008 | Howard | H01L 23/552 438/106 |
| 2011/0084378 A1 | 4/2011 | Welch et al. | |
| 2011/0095410 A1 | 4/2011 | Gomez | |
| 2012/0137514 A1 | 6/2012 | Hoang et al. | |
| 2012/0299191 A1 | 11/2012 | Camacho | |
| 2013/0093088 A1 * | 4/2013 | Chau | H01L 23/3128 257/784 |
| 2014/0217619 A1 * | 8/2014 | Zhao | H01L 25/105 257/784 |
| 2014/0307394 A1 | 10/2014 | Lobianco et al. | |
| 2015/0249021 A1 * | 9/2015 | Sanchez | H01L 23/4334 438/122 |
| 2017/0125395 A1 * | 5/2017 | Hohlfeld | H01L 24/20 |
| 2020/0027737 A1 | 1/2020 | Malado et al. | |
| 2020/0176412 A1 | 6/2020 | Kessler et al. | |
| 2020/0185293 A1 | 6/2020 | Schmalzl et al. | |
| 2020/0203242 A1 | 6/2020 | Koduri | |
| 2020/0321276 A1 | 10/2020 | Saw et al. | |
| 2020/0350222 A1 | 11/2020 | Danny Koh et al. | |
| 2020/0365553 A1 | 11/2020 | Meyer et al. | |
| 2020/0381380 A1 | 12/2020 | Lee et al. | |
| 2021/0020550 A1 * | 1/2021 | Chiang | H01L 23/293 |
| 2021/0366732 A1 | 11/2021 | Chiang et al. | |
| 2021/0391298 A1 | 12/2021 | Saw et al. | |

FOREIGN PATENT DOCUMENTS

| | | |
|---|---|---|
| DE | 102008051965 A1 | 7/2009 |
| DE | 102014107714 A1 | 12/2014 |
| DE | 102020108846 A1 | 10/2020 |
| EP | 4156253 A1 | 3/2023 |
| JP | 2015138824 A | 7/2015 |

* cited by examiner

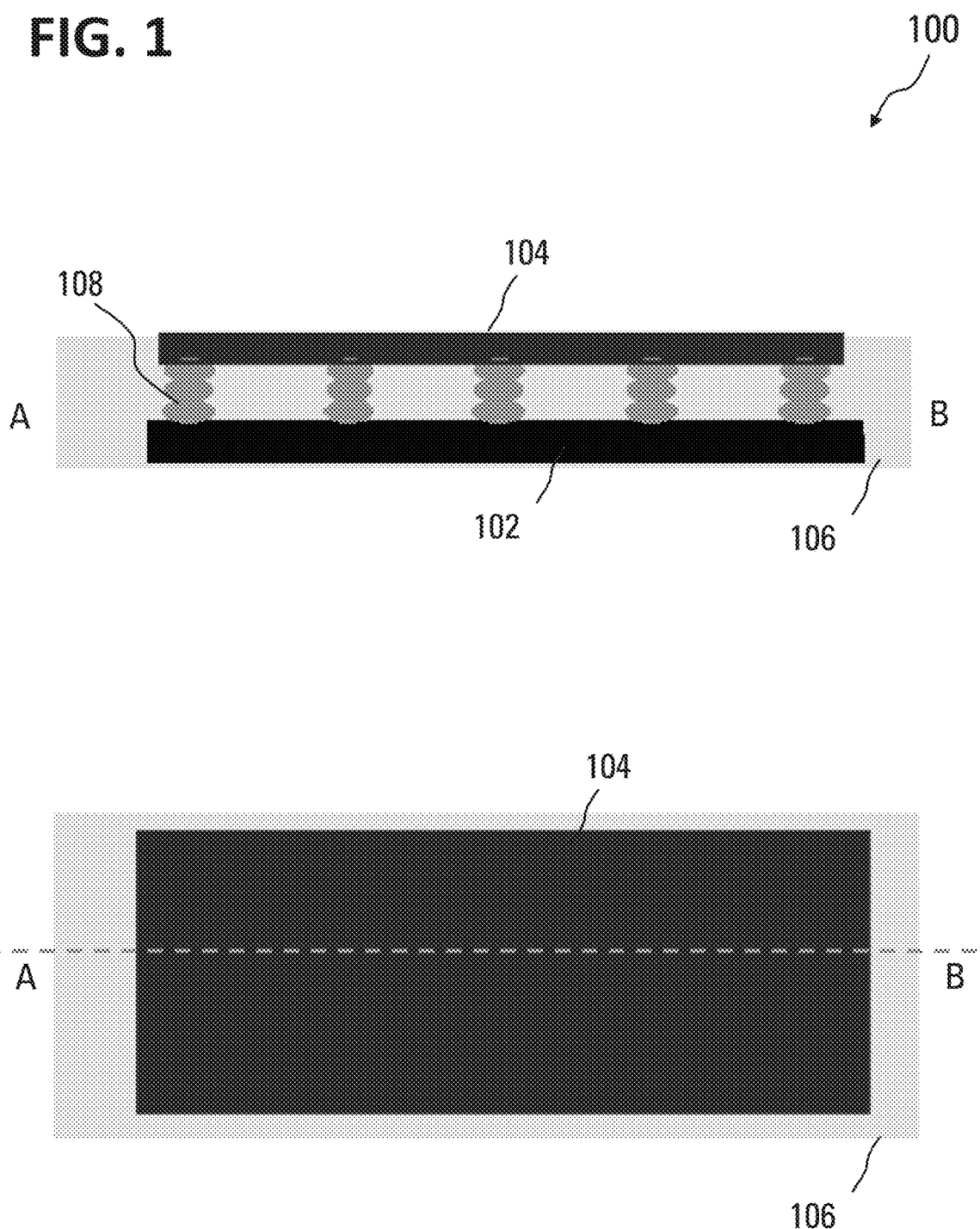

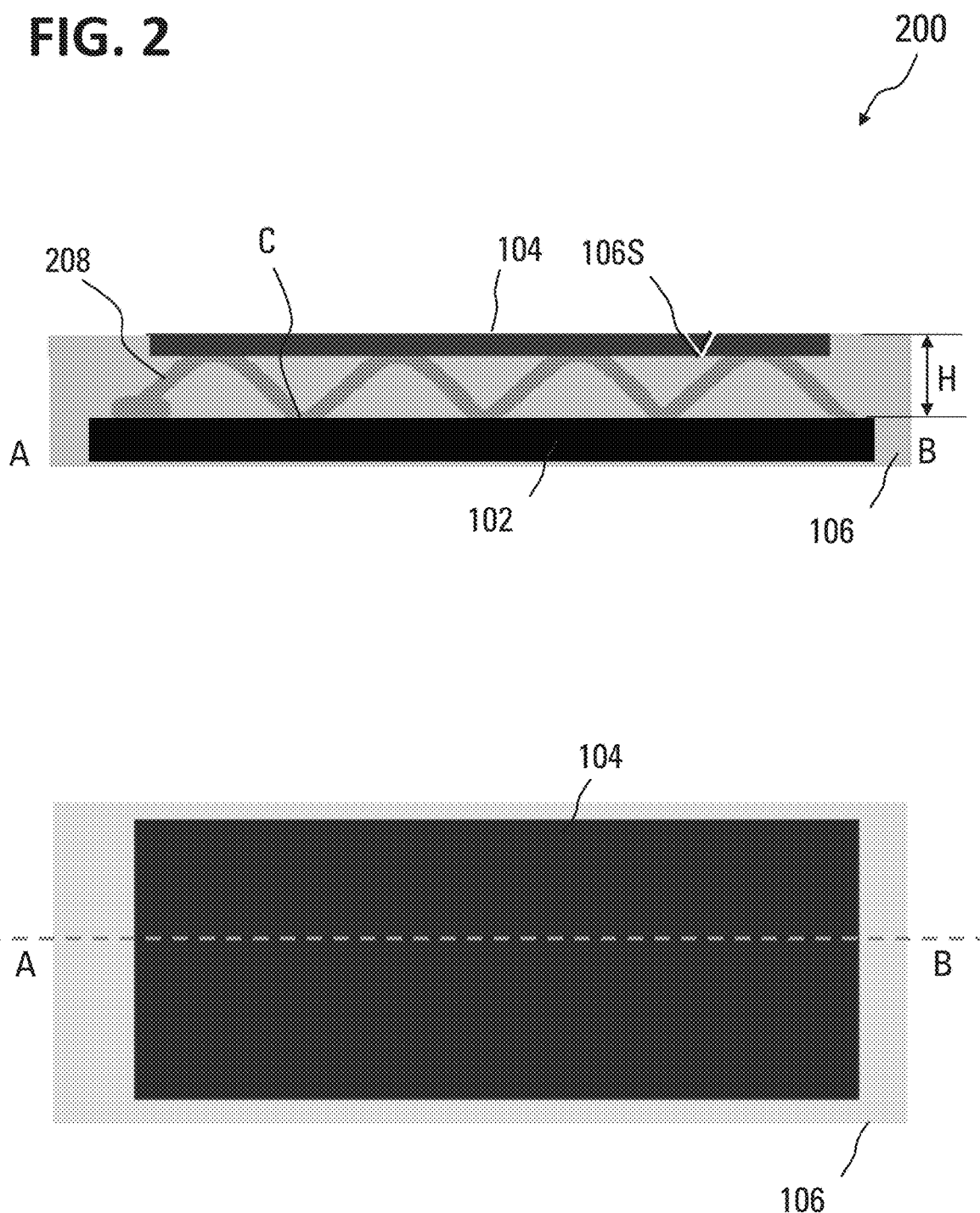

FIG. 3A
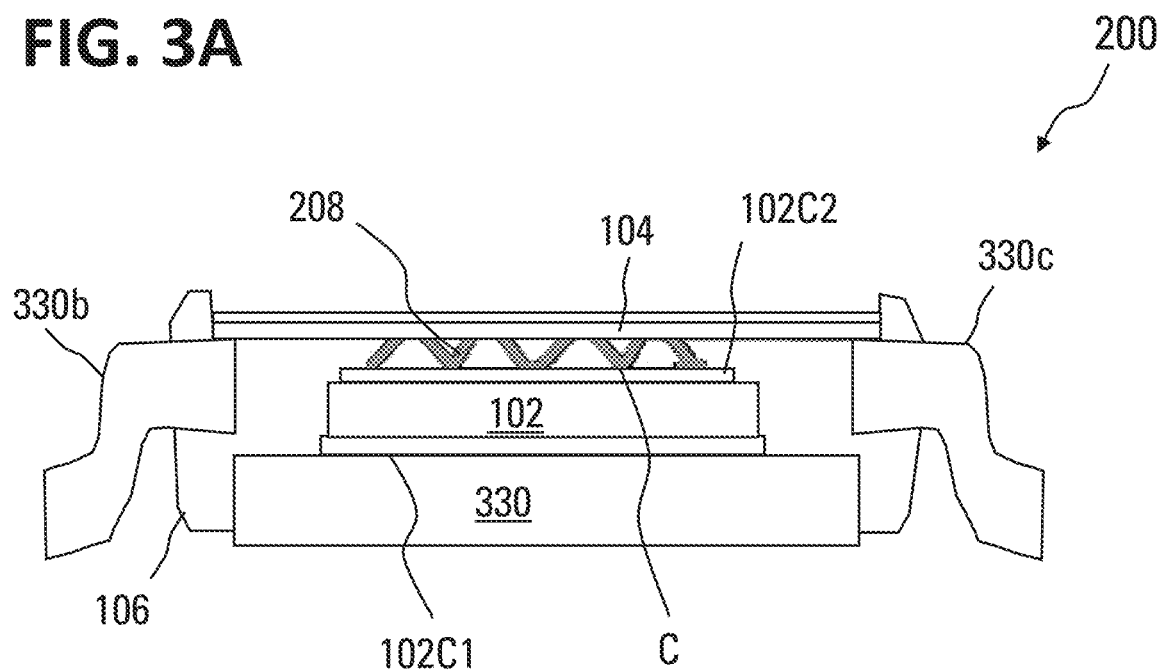
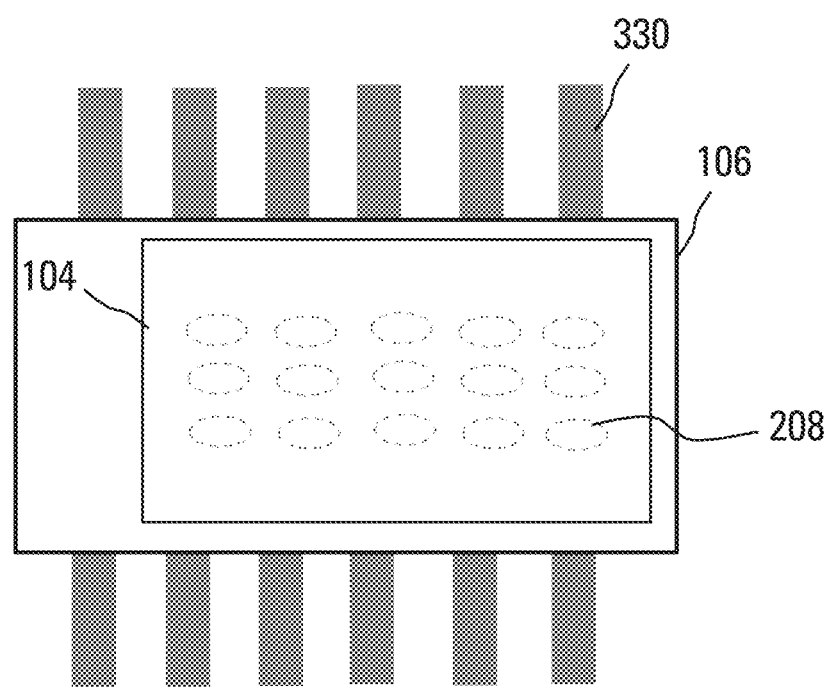

FIG. 3B
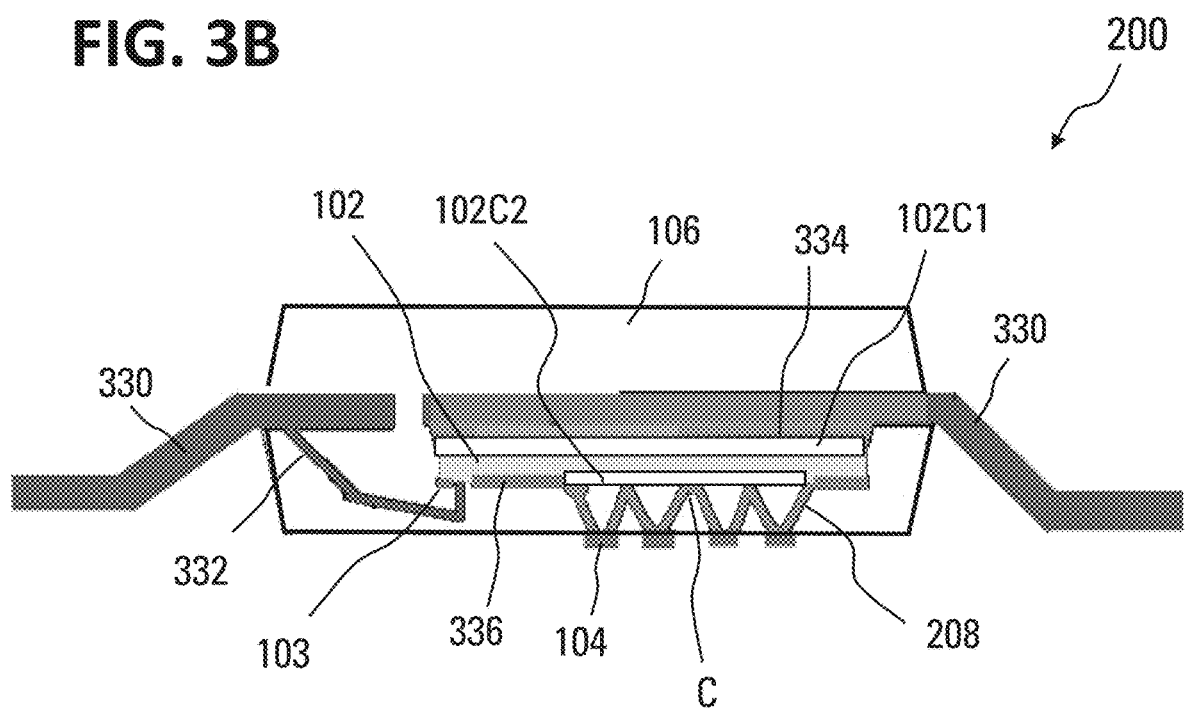
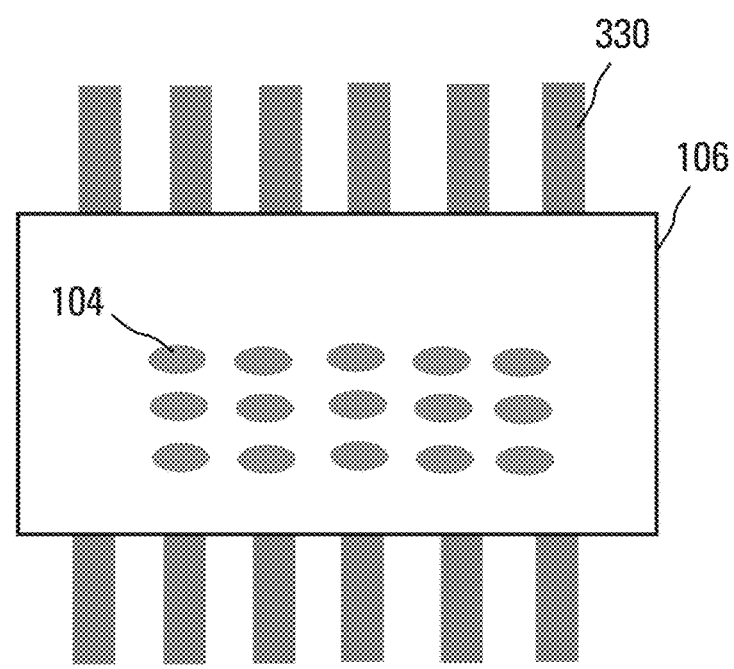

FIG. 3C
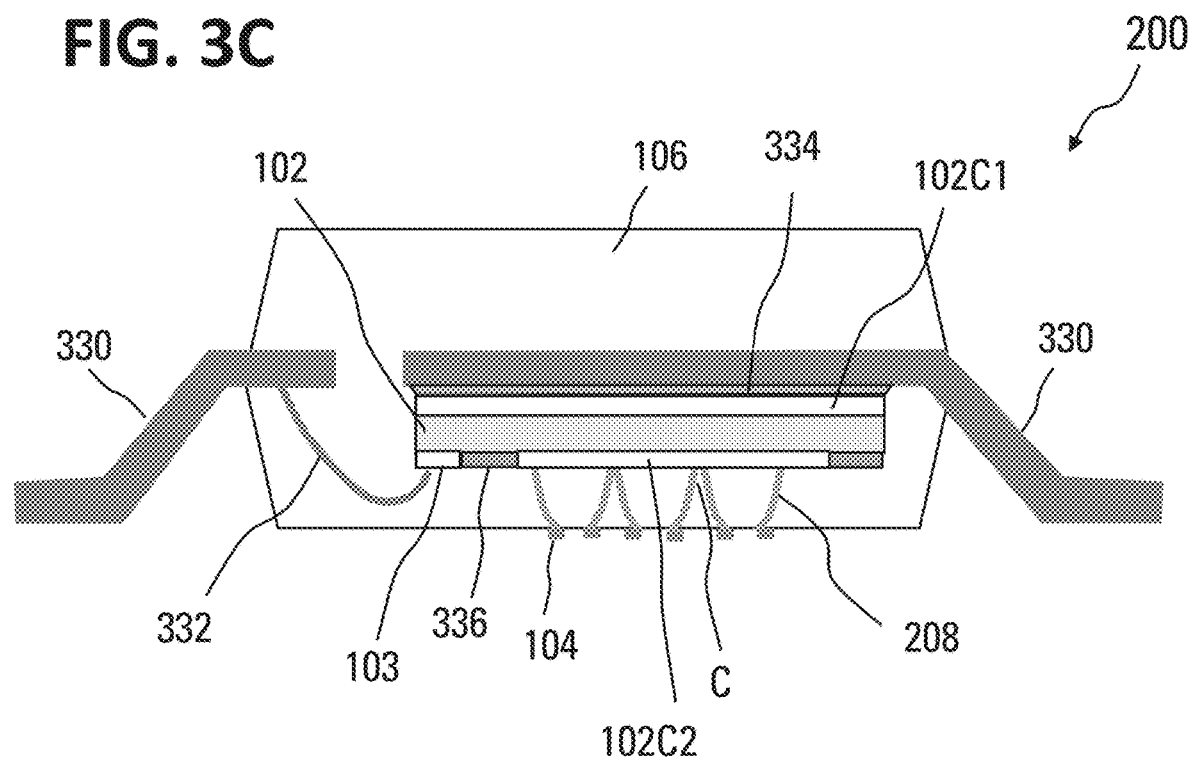
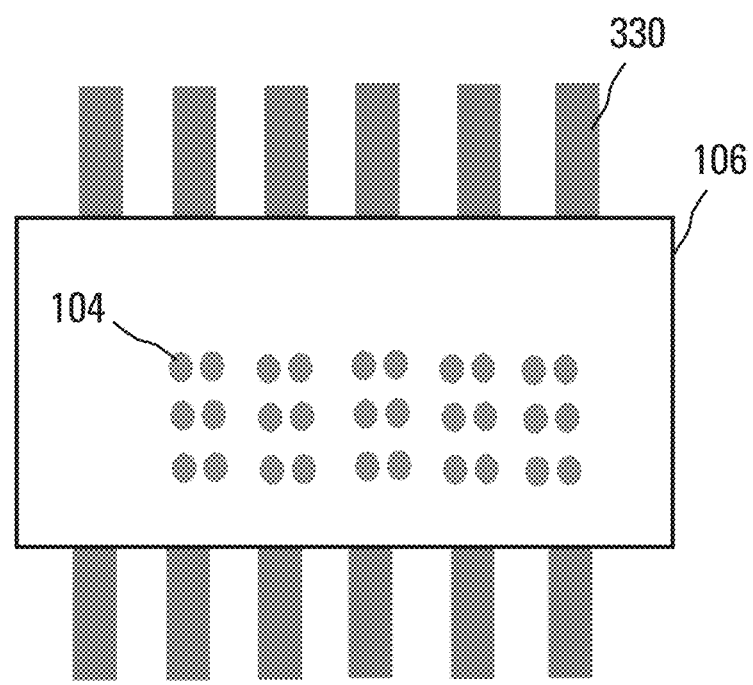

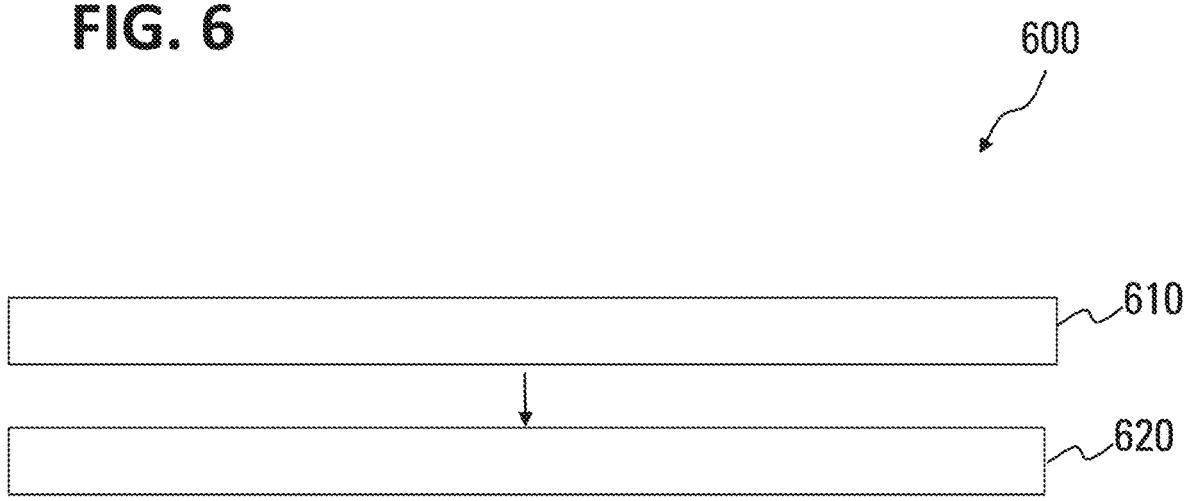

CHIP PACKAGE AND METHOD OF FORMING A CHIP PACKAGE

PRIORITY CLAIM

The instant application claims priority to U.S. application Ser. No. 17/556,341 filed on Dec. 20, 2021, and German Application 102022103210.8 filed on Feb. 11, 2022, the content of each reference being incorporated by reference in its entirety.

TECHNICAL FIELD

Various embodiments relate generally to a chip package and to a method of forming a chip package.

BACKGROUND

In chip packages according to a prior art, multiple vertical interconnects between a chip and a clip may be necessary for a power application. Examples for forming the vertical interconnect may include multiple stud bumps, copper pillars, and vertical wires. Each of these prior art interconnects may have their limitations.

SUMMARY

A chip package is provided. The chip package includes a chip with at least one contact pad, a contact structure formed from at least one continuous longitudinally extended electrically conductive element by attaching the conductive element to the contact pad in at least three contact positions, wherein the conductive element bends away from the contact pad between pairs of consecutive contact positions, and an encapsulation partially encapsulating the contact structure, wherein the encapsulation includes an outer surface facing away from the chip, and wherein the contact structure is partially exposed at the outer surface.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a schematic cross-sectional view and a schematic top view of a chip package according to a prior art;

FIG. 2 shows a schematic cross-sectional view and a schematic top view of a chip package according to various embodiments;

FIGS. 3A to 3C illustrate, each as a schematic cross-sectional view and a schematic top view, chip packages according to various embodiments;

FIG. 6 shows a flow diagram of a method of forming a chip package.

DETAILED DESCRIPTION

Figure 4A:
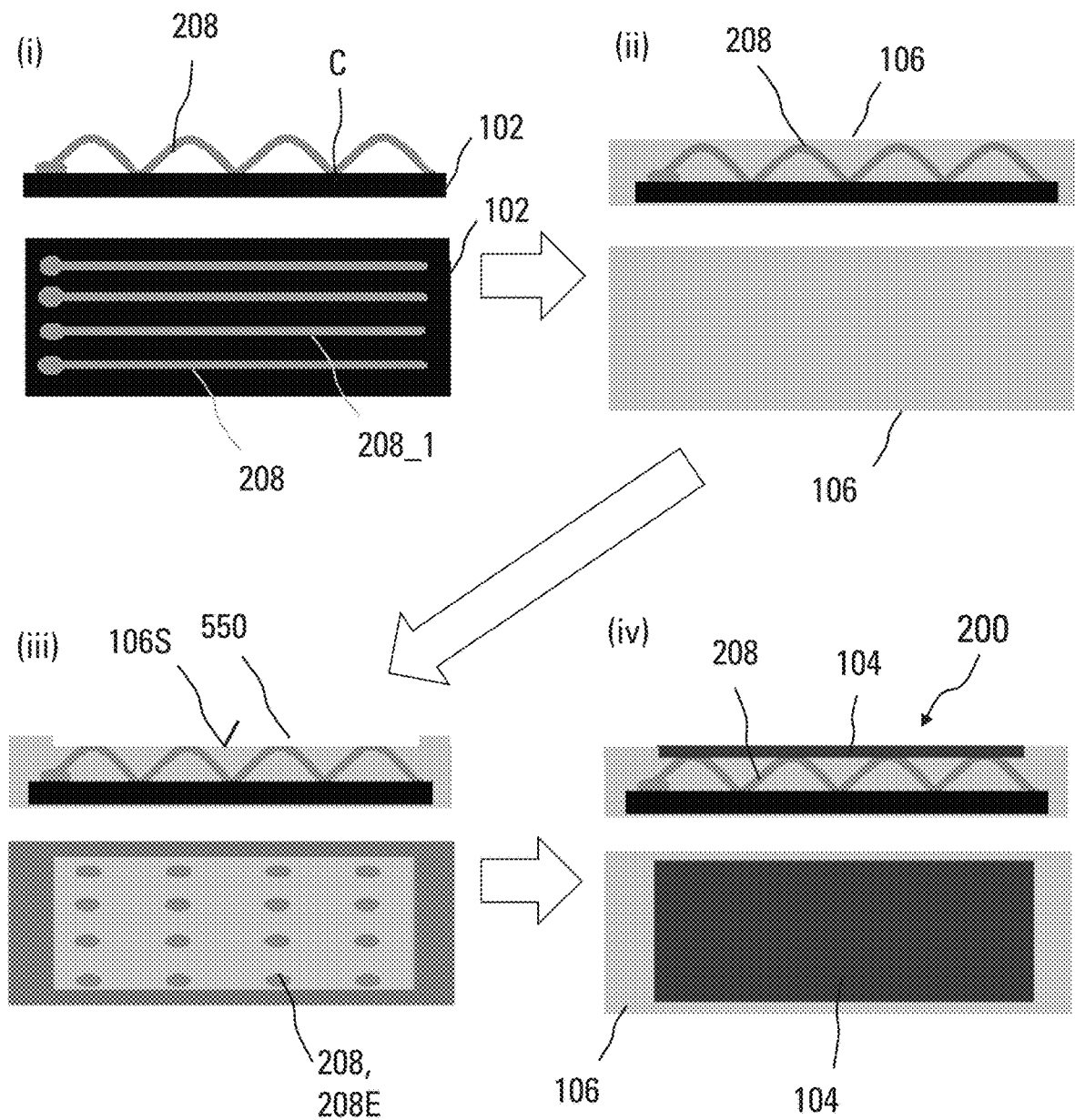
FIGS. 4A and 4B illustrates, each as a sequence of schematic cross-sectional views, a method of forming a chip package according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may also be used herein to mean that the deposited material may be formed "indirectly on" the implied side or surface with one or more additional layers being arranged between the implied side or surface and the deposited material.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

Various embodiments described herein provide a chip package and methods of manufacturing that may allow for one or more advantages over known packages and/or processes such as greater flexibility in the height of vertical interconnects, a reduction in manufacturing time and/or cost.

In various embodiments, a contact structure in a chip package may be formed from at least one continuous longitudinally extended electrically conductive element. The continuous longitudinally extended electrically conductive element (or, in the case of more than one, each of the continuous longitudinally extended electrically conductive elements) is attached to a contact pad of a chip in at least three contact positions in such a way that the conductive element bends away from the contact pad between pairs of consecutive contact positions. The continuous longitudinally extended electrically conductive element may for example be a bonding wire or a bonding riboon.

The chip package in accordance with various embodiments may allow a more flexible configuration of a height of a contact structure (e.g., a vertical interconnect) included in the chip package. Furthermore, a greater vertical interconnect height may be achieved compared to copper pillars, which may typically only be grown to a maximum height of about 45 to 70 μm, and vertical wire solutions. Vertical wire solutions generally suffer from a lack of stiffness beyond a certain height due to wire sweep and bending. Contact structures in various embodiments may also provide a larger contact surface with the contact pad of a chip and/or electrically conductive material compared to vertical wires.

The chip package may in various embodiments also include an encapsulation partially encapsulating the contact structure. The encapsulation may include a mold material as commonly used in chip packages.

In some embodiments, the encapsulation may include a platable mold compound that includes electrically conductive particles dispersed in a dielectric base material (the respective technology is referred to as platable mold technology, PMT). The platable mold compound may be used as a means to facilitate the deposition of an electrically conductive material such as a clip (e.g., a copper clip) for contacting the chip. The chip package may for example be used in power applications.

Further, a method of forming a chip package is provided. The method may include forming a contact structure by attaching at least one continuous longitudinally extended electrically conductive element to a contact pad of a chip in at least three contact positions, wherein the conductive element bends away from the contact pad between pairs of consecutive contact positions, and partially encapsulating the contact structure, wherein the contact structure is partially exposed at an outer surface of the encapsulation.

The methods of forming chip packages in the various embodiments may also provide advantages over alternative solutions in terms of a reduction in manufacturing time (thus leading to a corresponding increase in the number of units manufactured per hour (UPH)) and/or cost. For example, attaching a continuous longitudinally extended electrically conductive element to a contact pad of a chip in at least three contact positions using a wire or ribbon bonding process is faster and cheaper compared to the process of stacking multiple stud bumps shown in FIG. 1 at three contact positions. Similarly, the various embodiments may also be faster compared to attaching multiple vertical wires where a pre-cut step prior to bonding is typically required in order to ensure uniform wire length.

An example of a chip package 100 with a chip 102, a clip 104, an encapsulation material 106, and multiple stud bumps 108 is illustrated in FIG. 1. The arranging of the multiple stud bumps 108, which may require stacking to reach a pre-defined height, may on the one hand be time consuming, and may on the other hand stress the chip 102 by the pressure exerted on the chip 102 by the rigid bump material.

Copper pillars may be grown in situ, but the technique may be expensive due to the high density that may be required, and a maximum height is limited to about 70 μm.

Vertical wires may be able to achieve large maximum heights but may be limited to a narrow range in acceptable stiffness and may not be sufficiently robust against wire sweep and/or bending. Furthermore, they may be attached by a small tip, which reduces surface contact, and which may need to be performed one by one, which is a slow process.

FIG. 2 shows a schematic cross-sectional view (at the top of the page) and a schematic top view (at the bottom) of a chip package 200 according to various embodiments, and FIGS. 3A to 3C illustrate, each as a schematic cross-sectional view, and a schematic bottom view (FIGS. 3B and 3C) and top view, respectively (FIG. 3A), chip packages 200 according to various embodiments.

In various embodiments illustrated in FIGS. 2 and 3A to 3C, the chip package 200 includes a chip 102 with at least one contact pad (102C1, 102C2), for example a copper contact pad. The chip package 200 further includes a contact structure 208 formed from a continuous longitudinally extended electrically conductive element (e.g., a bonding wire or bonding ribbon, for example including or consisting of copper) by attaching the conductive element 208 to the contact pad 102C1 or 102C2 in at least three contact positions C.

A length of the contact structure 208 between consecutive contact positions C may be larger than a separation of the consecutive contact positions C. For example, the contact structure 208 may have a wave like pattern with multiple inflection points. In the FIGS. 2 and 3A examples, the contact positions C are located at inflection points which are concave downward. The contact positions C may also be located at inflection points which are concave upwards like in FIGS. 3B and 3C. As a consequence, the contact structure 208 may bend away from the contact pad 102C1 or 102C2 between (e.g., consecutive) pairs of contact positions C. In the context of contact positions C of the contact structure 208, "consecutive" may refer to contact positions C that follow each other along the length of the continuous longitudinally extended electrically conductive element. In the case that more than one longitudinally extended electrically conductive element is used for forming the contact structure 208, each of the conductive elements has a plurality of consecutive contact positions C. A smaller spacing between consecutive contact positions C is generally preferred so that there are more points of contact between the contact structure and the contact pad. In various implementations, the minimum distance may be determined by the size and/or profile of the capillary tip used for bonding the electrically conductive element to the contact pad. The minimum distance being sufficient to prevent the tip from contacting a consecutive contact position C.

The attachment process using the continuous longitudinally extended electrically conductive element that is longer than the separations between each pair of consecutive contact positions C causes the bending away of the conductive element from the contact pad 102C1 or 102C2, respectively. At the contact position C, the conductive element may have a U- or V-shape, with the legs of the U or V, respectively, extending away from the contact pad. Between the contact positions C, the longitudinally extended electrically conductive element may be smoothly curved, for example without sharp edges. An angle of the longitudinally extended electrically conductive element with respect to the contact pad 102C1 or 102C2 may be shallower near the contact position and in a top region furthest away from the contact pad than in a middle section between the contact pad and the top portion. Even in embodiments where the at least one continuous longitudinally extended electrically conductive element from which the contact structure 208 is initially formed is later partially removed at the top and thereby separated into individual segments, the above described and further features of the three-dimensional arrangement of the segments shows that the segments were initially arranged using the at least one continuous longitudinally extended electrically conductive element.

The process for attaching a contact structure 208 to a contact pad may for example include or consist of wire bonding, ribbon bonding, or ultrasonic bonding. Other methods such as soldering, gluing, and the like may also be used.

In various embodiments, the continuous longitudinally extended electrically conductive element may be shaped during the attachment process to form the contact structure 208 that bends away from the contact pad 102C1 or 102C2, respectively. For example, the contact structure 208 may include one or more continuous longitudinally extended electrically conductive elements in the form of bond wire or bond ribbon. The bond wire or bond ribbon being attached to the contact pad 102 using wire bonding or ribbon bonding processes.

Figure 4B:
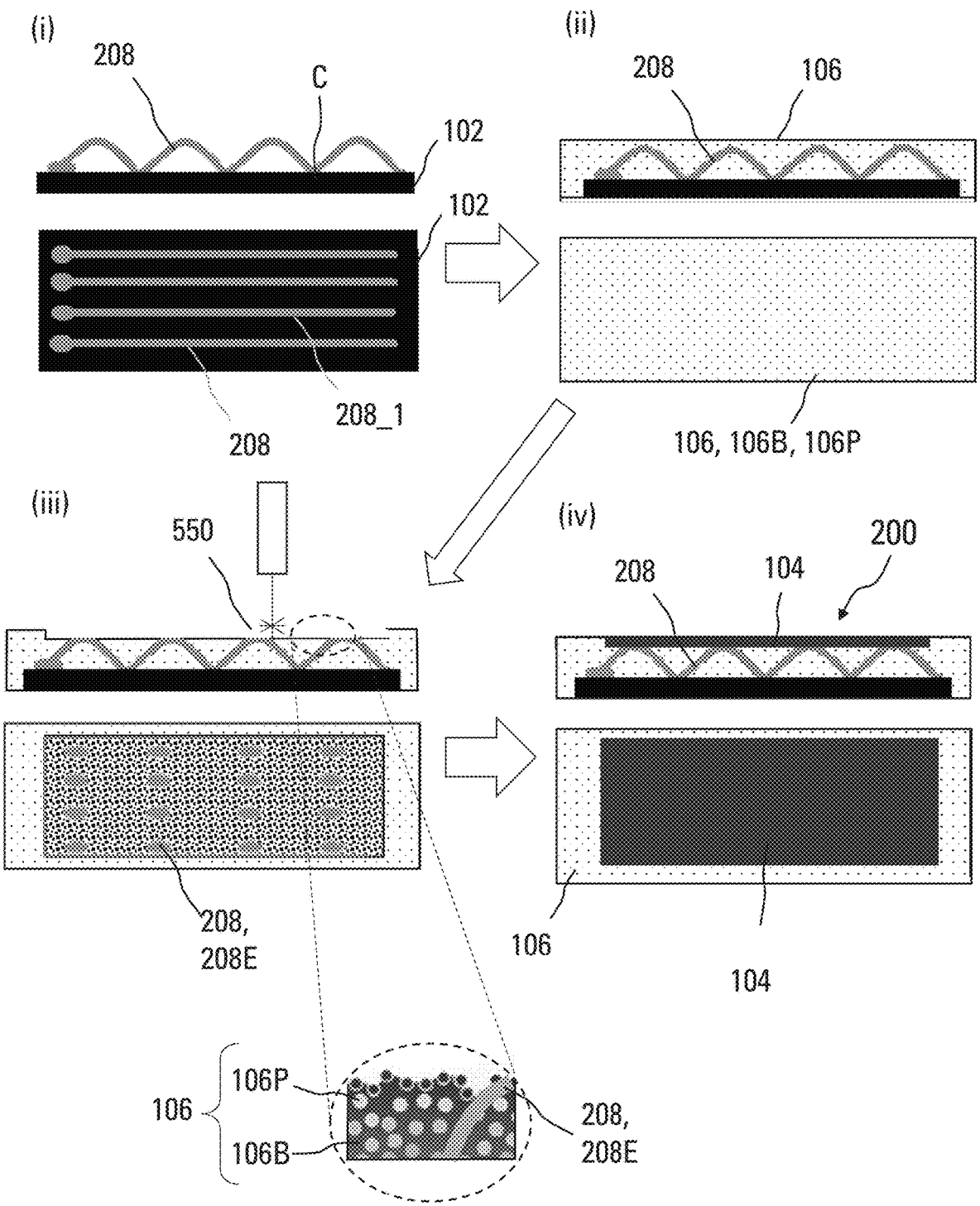
Figure 5:
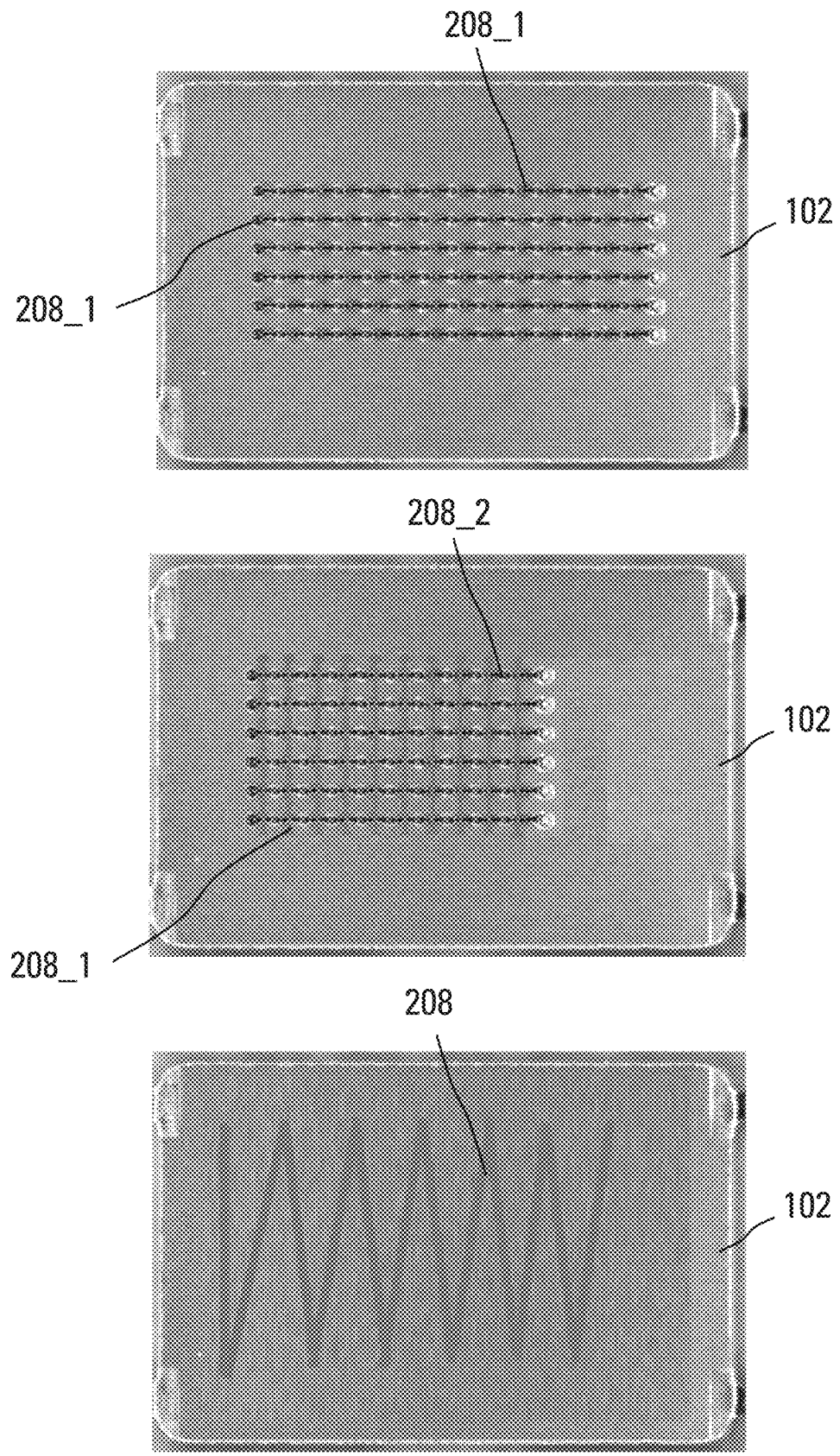
FIG. 5 shows different contact structures provided in chip packages in accordance with various embodiments.

In some embodiments, the contact structure 208 may extend along one direction. For example as shown in FIGS. 4A and 4B, and the top panel of FIG. 5, where a plurality of continuous longitudinally extended electrically conductive elements 208_1 are formed parallel to each other, extending along the same direction. The contact structure 208 may also comprise one or more continuous longitudinally extended electrically conductive element that extend in more than one direction. For example, in the middle panel of FIG. 5, a first plurality of continuous longitudinally extended electrically conductive elements 208_1 are formed extending along a first direction and parallel to each other, and a second plurality of continuous longitudinally extended electrically conductive elements 208_2 are formed extending along a second direction orthogonal to the first direction thus forming a mesh like pattern. In various embodiments, the contact structure 208 may be arranged in a two-dimensional plane, for example as a zig-zag structure as shown in the bottom panel of FIG. 5, or for example as a meandering structure (not shown).

The contact structure 208 may in various embodiments be used for providing a vertical interconnect in the chip package 200. The chip package 200 may be used in power applications. Thus, it may be desirable to provide a large electrically conductive cross-section for the vertical interconnect for conducting as much current as possible in the vertical direction. In various embodiments, essentially a whole area of the chip contact pad 102C1 or 102C2, respectively, may be covered, e.g. with a regular pattern, by the contact structure 208. In various embodiments, for example if there is no need for conducting a large current, a single contact structure 208 or one or more contact structures that fill only a fraction of the area of the chip contact pad 102C1 or 102C2, respectively, may be sufficient.

The chip package 200 may further include an encapsulation 106 partially encapsulating the contact structure 208, wherein the encapsulation 106 may include an outer surface 106S facing away from the chip 102, and wherein the contact structure 208 is partially exposed at the outer surface 106S (for example, as shown in FIG. 4A(iii)).

The encapsulation 106 may in various embodiments be a mold material as commonly used in chip packages of the prior art. A corresponding process is illustrated in FIG. 4A.

In various embodiments, the encapsulation 106 may include or consist of a platable mold compound that includes electrically conductive particles 106P dispersed in a dielectric base material 106B, for example as illustrated in FIG. 4B.

The encapsulation 106 may be arranged essentially as known in the art.

In various embodiments, a mold that may be arranged around the chip 102 and the contact structure 208 to be filled with a mold material forming the encapsulation 106 may be configured in a way that directly exposes the portions of the contact structure 208 on the outer surface 106S of the encapsulation 106. For example, the encapsulation process may comprise a film assisted molding process, whereby an area overlying the contact structure 208 is protected and not filled with mold material.

In other embodiments, the contact structure 208 may be completed covered by mold material and the encapsulation 106 may be processed, for example after it is cured, to partially expose the contact structure 208, for example by grinding, laser processing, etching or other suitable techniques known in the art. This process is indicated in FIG. 4A and FIG. 4B, respectively, in the transition from process (ii) to (iii). In embodiments where the encapsulation is a platable mold compound, laser processing (such as laser direct structuring) may be used both for encapsulation material removal and activation.

In various embodiments, an electrically conductive material 104 may be arranged on the outer surface 106S in contact with the exposed contact structure 208. Examples of electrically conductive material 104 include conductive clips, plates, pads and/or lines. The electrically conductive material 104 may take the form of a unitary electrically conductive surface such as a clip for example as shown in FIGS. 2 and 3A, or include a plurality of electrically conductive surfaces (104) as shown in the exemplary embodiments of FIGS. 3B and 3C.

The electrically conductive material 104 may also be pre-formed or deposited. The electrically conductive material 104 may in various embodiments be arranged by any suitable know process for forming a metal layer in a chip package. In various embodiments in which the encapsulation includes or consists of the platable mold compound 106, 106P, 106B (see FIG. 4B), the electrically conductive material 104 may include an electrically conductive layer 104, 104_1 formed at least in part using the electrically conductive particles 106P embedded in the dielectric base material 106B. For example, the dielectric base material 106B may be a laser-activatable mold compound comprising metal atoms which can be activated by laser processing. These metal atoms act as a nuclei for the deposition of metal or metal alloys (e.g. Cu, Ni, NiP, Au, Cu/Ni/Au stack, etc.) by e.g. plating or coating in the regions of the mold compound activated by a laser ("laser-activated regions"). The electrically conductive material 104 may subsequently be formed by plating or coating the laser-activated regions of the dielectric base material 106B with a metal/metal alloy or other electrically conductive substances. Depending of requirements, the electrically conductive layer formed from the electrically conductive particles 106P may function as the final metallization layer, or it may form a base layer for further metallization layers 104_2 to be applied. The electrically conductive material thus formed may function as metal clips, pads and/or conductive traces.

A thickness H (see FIG. 2) of the encapsulation 106 over the chip pad 104C1 or 104C2, respectively, may be in a range from about 40 µm to about 1 mm, for example between 100 µm and 700 µm, for example between 200 µm and 500 µm. The thickness may be easily adjustable. As for example illustrated by a comparison of FIG. 3B and FIG. 3C, a thickness H to which the encapsulation 106 is removed (whereby an opening 550 may be formed, see FIG. 5) may determine at which position the contact structure 208 is exposed, and if the contact structure, after the partial removing of the encapsulation 106 still forms a continuous structure or individual segments, but any thickness H may expose portions of the contact structure 208 and may thus be suitable as the final thickness H.

In various embodiments, the chip package 200 may be configured for power applications and the chip 102 may be configured as a power semiconductor chip. In some embodiments, the contact pad (102C1 or 102C2) to which the contact structure 208 is attached is a source contact pad.

FIG. 3A shows a leaded chip package 200 including a chip 102 mounted on a die paddle of a leadframe 330. The chip 102 includes a contact pad 102C2 located on a first side of the chip 102 and a second contact pad 102C1 located on a second opposite side. A contact structure 208 functions as a vertical interconnect for coupling the contact pad 102C2 with an electrically conductive material 104 that is located above an upper surface of the encapsulation 106. The contact structure 208 includes a continuous longitudinally extended electrically conductive element which is attached to the contact pad 102C1 in at least three contact positions C where the conductive element bends away from the contact pad 102C2. In this example, the electrically conductive material 104 extends beyond the width of the chip 102 to make direct electrical contact with the leads (330*b*, 330*c*)

of the leadframe. The electrically conductive material 104 may, for example, be a conductive clip or plate that is either pre-formed or deposited. In some implementations, the chip may be configured as a power semiconductor device. It may be desirable in the case of power semiconductor devices for the contact structure to occupy more than 50% of the contact pad 102C2 so as to provide a large cross-section for current conduction. The chip 102 may also be configured as a vertical device in a source-up configuration with the contact pad 102C2 functioning as a source contact pad and the second contact pad 102C1 a drain contact pad. Alternatively, the chip 102 may be arranged in a source-down configuration with the source contact pad at the bottom (102C1 instead of 102C2), the drain contact pad at the top and the contact structure coupled to the bottom contact pad.

The chip package 200 may in various embodiments be configured as a vertical device (such as a vertical transistor) in a source-down configuration, an example of which is illustrated in FIG. 3B. In the FIG. 3B example, the electrically conductive material 104 comprises a plurality of individual electrically conductive surfaces which are formed on exposed portions 208E (see FIG. 4A) of the conductive structure 208. The electrically conductive material 104 may be configured as a plurality of external contact points which protrude out of a lower surface of the encapsulation 106 thus facilitating the attachment of the chip package 200 to another surface such as a substrate like a printed circuit board (PCB). The larger contact area between a chip package 200 like in the FIG. 3B embodiment and a PCB results in a low thermal impedance between the junction and the leads and may result in higher thermal efficiency compared to typical surface mount packages. Additionally, locating a source pad close to a PCB board may also improve the switching speed of the chip 102. In some implementations, the electrically conductive material 104 may be composed of a solderable material such as tin to further facilitate the ease of attaching the chip package 200 to another surface such as a PCB. In the FIG. 3B example, the contact structure takes the form of a continous electrically conductive element. The molding process may involve the use of a selective molding process such as film assist molding so that the tops of the electrically conductive material 104 are left exposed 208E and not covered with encapsulation. Consequently, the contact structure includes one or more continuous longitudinally extended electrically conductive elements. The electrically conductive material 104 may be formed by selectively depositing a conductive material on the exposed portions 208E of the contact structure 208 (for example by plating). Preferably, the conductive material is a solderable material such as tin or nickel gold (by electroless nickel gold plating). Other materials may also be suitable. In other embodiments, the electrically conductive material 104 may alternatively be formed as a continuous layer as opposed to individual electrically conductive surfaces (also referred to as a structured layer) instead.

In various embodiments, the chip 102 in FIG. 3B may be configured as a vertical device such as a vertical transistor. For example, the chip 102 may be arranged in a source-down configuration with the contact pad 102C1 located on the bottom side of the chip functioning as a source contact pad and a drain contact pad 102C2 located on a top side of the chip. The top side of the chip may be attached to a lead 330c (e.g. drain lead) via an electrically conductive adhesive 334 such as solder. The chip 102 may further comprise a gate pad 103 located on the same side of the chip 102 as the source contact pad 102C1. The leads (330a, 330b) protrude from the encapsulation 106. It is to be appreciated that gate and drain connections are not limited to those illustrated in FIG. 3B. Other types of connectors such as clip may also be suitable. The chip package 200 may also be a leadless package.

FIG. 3C shows a chip package 200 according to another embodiment. The FIG. 3C chip package is similar to that of FIG. 3B, but the contact structure 208 is comprised of individual segments instead of being continuous. The FIG. 3C package may be formed by encapsulating the entire contact structure 208 with mold and removing portions of the mold to expose the contact structure (for example by grinding). The mold removal process also removes the tops of the contact structure adjacent to the exterior surface of the encapsulation 106. In other words, the segmented contact structure 208 shown in FIG. 3C is formed from from at least one continuous longitudinally extended electrically conductive element by a process that is similar or identical to what was described above in context with FIG. 3A and FIG. 3B, respectively, and later partially removed, thereby forming the individual segments.

Electrically conductive material 104 may then be formed on exposed portions 208E of the conductive structure 208 using the various methods described in relation to FIG. 3B.

FIG. 6 shows a flow diagram 600 of a method of forming a chip package.

The method may include forming a contact structure by attaching at least one continuous longitudinally extended electrically conductive element to a contact pad of a chip in at least three contact positions, wherein the conductive element bends away from the contact pad between pairs of consecutive contact positions (610), and partially encapsulating the contact structure, wherein the contact structure is partially exposed at an outer surface of the encapsulation (620).

FIGS. 4A and 4B illustrate, as a sequence of schematic cross-sectional views, methods for forming a chip package according to various embodiments.

As shown in FIG. 4A(i)(as cross-sectional and top view), the contact structure 208 (e.g., multiple ribbon or wire bonds) may be attached to a contact pad 102C1 of the chip 102 in contact positions C. In various embodiments, the contact structure 208 may be attached to the contact pad 102C1 using a wire-bonding or ribbon bonding process. The chip 102 with the attached contact structure 208 may subsequently be partially encapsulated by the encapsulation 106 leaving the portions of the contact structure exposed 208E (not shown). Alternatively, the encapsulation 106 may initially completely encapsulate the contact structure 208, like in FIG. 4A(ii), and may subsequently be partially removed (see FIG. 4A(iii)) to expose the contact structure 208 at an outer surface 106S of the encapsulation 106. Methods such as grinding, etching or laser processing may used for partial removal of the encapsulation. Depending on the processes used, the tops of the electrically conductive element may be left intact or removed. In the former case, the resulting contact structure includes one or more continuous longitudinally extended electrically conductive elements and in the latter individual segments. Subsequently, an electrically conductive material 104 may be arranged, onto the outer surface 106S of the encapsulation 106 in contact with exposed portions 208E of the contact structure 208 (FIG. 4A(iv)). The electrically conductive material 104 may, for example, be a pre-formed structure such as a conducive clip, plate or other forms of conductive connectors. The electrically conductive material 104 may also be deposited.

FIG. 4B illustrates another exemplary method for forming a chip package similar to that illustrated in FIG. 4A. However, in this example, the encapsulation material 106 is a platable mold compound 106 that includes electrically conductive particles 106P in a dielectric base material 106B. The use of platable mold compound makes it possible to define the area for an electrically conductive material and form at least part of it using the electrically conductive particles 106P embedded in the platable mold compound. The dielectric base material 106B may, for example, be a laser-activatable mold compound including at least one additive e.g. in the form of an organic metal complex which is activatable by a physio-chemical reaction induced by laser processing. The laser induced physio-chemical reaction causes metal atoms to be freed from the metal complex thereby acting as a nuclei for the deposition of metal or metal alloys (e.g. Cu, Ni, NiP, Au, Cu/Ni/Au stack, etc.) by e.g. plating or coating in the regions of the mold compound activated by a laser ("laser-activated regions"). The starting structure in FIG. 4B(i) may be similar to that shown in FIG. 4A(i). The contact structure may be subsequently completely covered with an encapsulation material 106 in the form of a platable mold compound (FIG. 4B(ii)). The encapsulation 106 is then partially removed to expose portions of the the contact structure 208E at an outer surface of the encapsulation FIG. 4B(iii). In some embodiments, a laser direct structuring process may be used both for partial removal of encapsulation material and activation of the electrically conductive particles 106P in the encapsulation. An electrically conductive material 104 or a part thereof may be subsequently formed by plating or coating the laser-activated regions of the encapsulation 106 (which has the same pattern as the desired electrically conductive material) with a metal/metal alloy or other electrically conductive substances (FIG. 4B(iv)). The electrically conductive material thus formed may function as metal clips, pads and/or conductive traces.

Various examples will be illustrated in the following:

Example 1 is a chip package. The chip package includes a chip with at least one contact pad, a contact structure formed from at least one continuous longitudinally extended electrically conductive element by attaching the one conductive element or, respectively, each of the more than one conductive elements, to the contact pad in at least three contact positions, wherein the at least one conductive element bends away from the contact pad between pairs of consecutive contact positions, and an encapsulation partially encapsulating the contact structure, wherein the encapsulation includes an outer surface facing away from the chip, and wherein the contact structure is partially exposed at the outer surface.

In Example 2, the subject matter of Example 1 may optionally further include an electrically conductive material arranged on the outer surface in contact with the exposed contact structure, for example a clip or a plurality of individual external contact points which are exposed outside of the encapsulation to be soldered.

In Example 3, the subject matter of Example 1 or 2 may optionally further include that the at least three contact positions are arranged in a straight line.

In Example 4, the subject matter of Example 1 or 2 may optionally further include that the contact structure includes four or more contact positions, and wherein the exposed portions of the contact structure form a two-dimensional pattern.

In Example 5, the subject matter of any of Examples 1 to 4 may optionally include that the contact structure includes at least two continuous longitudinally extended electrically conductive elements, each of which is attached to the contact pad in at least three contact positions.

In Example 6, the subject matter of any of Examples 1 to 5 may optionally further include that a two-dimensional portion of the outer surface enclosed by the exposed portions of the contact structure amounts to at least 50% of the outer surface.

In Example 7, the subject matter of Example 5 or 6 may optionally further include that the contact structure is formed from a first set of continuous longitudinally extended electrically conductive element having contact positions are arranged along a first direction, and e from a second set of continuous longitudinally extended electrically conductive elements having contact positions that are arranged along a second direction that is parallel or at an angle to the first direction.

In Example 8, the subject matter of any of Examples 1 to 7 may optionally further include that the exposed portions of the contact structure form at least part of a matrix pattern.

In Example 9, the subject matter of any of Examples 1 to 8 may optionally further include that the encapsulation includes or consists of a platable mold compound that includes electrically conductive particles dispersed in a dielectric base material.

In Example 10, the subject matter of Examples 2 and 8 may optionally further include that in the electrically conductive material includes an electrically conductive layer formed using the electrically conductive particles released from the dielectric base material.

In Example 11, the subject matter of any of Examples 1 to 10 may optionally further include that the electrically conductive material includes a deposited metal or metal alloy layer.

In Example 12, the subject matter of any of Examples 1 to 11 may optionally further include that a thickness of the encapsulation over the chip pad is between 40 µm and 1 mm.

In Example 13, the subject matter of any of Examples 2 to 12 may optionally further include that the electrically conductive material is a conductive clip.

In Example 14, the subject matter of any of Examples 2 to 12 may optionally further include that the electrically conductive material is configured as a plurality of individual external contact points protruding out of the outer surface of the encapsulation.

In Example 15, the subject matter of Example 14 may optionally further include that the plurality of individual electrically conductive surfaces are composed of a solderable material.

In Example 16, the subject matter of any of Examples 1 to 15 may optionally further include that the contact structure includes a bond wire or a bond ribbon.

In Example 17, the subject matter of any of Examples 1 to 16 may optionally further include that the contact structure and/or the contact pad includes copper.

In Example 18, the subject matter of any of Examples 1 to 17 may optionally further include that the contact structure is a continuous structure.

In Example 19, the subject matter of any of Examples 1 to 17 may optionally further include that the contact structure includes a plurality of individual contact segments, each of which is exposed at the outer surface.

In Example 20, the subject matter of any of Examples 1 to 19 may optionally further include that the chip is configured as a power semiconductor chip.

In Example 21, the subject matter of Example 20 may optionally include that the contact pad to which the contact structure is attached is a source contact pad.

In Example 22, the subject matter of Example 21 may optionally include that the source contact pad is located on a first side of the chip, the chip further comprising a drain contact pad located on a second side of the chip opposite to the first side.

Example 23 is a method of forming a chip package. The method may include forming a contact structure by attaching at least one continuous longitudinally extended electrically conductive element to a contact pad of a chip in at least three contact positions, wherein the conductive element bends away from the contact pad between pairs of consecutive contact positions, and partially encapsulating the contact structure, wherein the contact structure is partially exposed at an outer surface of the encapsulation.

In Example 24, the subject matter of Example 23 may optionally further include arranging an electrically conductive material on the outer surface in contact with the exposed contact structure.

In Example 25, the subject matter of Example 23 or 24 may optionally further include that the at least three contact positions are arranged in a straight line.

In Example 26, the subject matter of Example 23 or 24 may optionally further include that the at least three contact positions include four or more contact positions, and wherein the exposed portions of the contact structure form a two-dimensional pattern.

In Example 27, the subject matter of any of Examples 23 to 26 may optionally further include that the contact structure is formed from a first set of continuous longitudinally extended electrically conductive element having contact positions are arranged along a first direction, and from a second set of continuous longitudinally extended electrically conductive elements having contact positions that are arranged along a second direction that is parallel or at an angle to the first direction.

In Example 28, the subject matter of any of Examples 23 to 27 may optionally further include that a two-dimensional portion of the outer surface enclosed by the exposed portions of the contact structure amounts to at least 50% of the outer surface.

In Example 29, the subject matter of any of Examples 23 to 28 may optionally further include that the exposed portions of the contact structure form at least part of a matrix pattern.

In Example 30, the subject matter of any of Examples 23 to 29 may optionally further include that the encapsulation includes or consists of a platable mold compound that includes electrically conductive particles dispersed in a dielectric base material.

In Example 31, the subject matter of Examples 23 and 30 may optionally further include that the electrically conductive material includes an electrically conductive layer formed by electrically conductive particles released from the dielectric base material.

In Example 32, the subject matter of any of Examples 24 to 31 may optionally further include that the arranging the electrically conductive material includes depositing a metal layer.

In Example 33, the subject matter of any of Examples 23 to 32 may optionally further include that a thickness of the encapsulation over the chip pad is between 40 µm and 1 mm.

In Example 34, the subject matter of any of Examples 23 to 32 may optionally further include that the contact structure includes a bond wire or a bond ribbon.

In Example 35, the subject matter of any of Examples 23 to 32 may optionally further include that the contact structure and/or the contact pad includes copper.

In Example 36, the subject matter of any of Examples 23 to 33 may optionally further include that the contact structure is a continuous structure.

In Example 37, the subject matter of any of Examples 23 to 36 may optionally further include fully encapsulating the contact structure and removing a portion of the encapsulation, thereby partially exposing the contact structure at the outer surface of the encapsulation.

In Example 38, the subject matter of Example 37 may optionally further include partially removing the contact structure, thereby separating the contact structure into a plurality of individual contact segments, each of which is exposed at the outer surface.

In Example 39, the subject matter of Example 38 may optionally further include that the electrically conductive material is configured as a plurality of individual external contact points protruding out of the outer surface of the encapsulation.

In Example 40, the subject matter of any of Examples 23 to 39 may optionally further include that the chip is configured as a power semiconductor chip.

In Example 41, the subject matter of Example 40 may optionally further include that the chip is configured as a power semiconductor chip.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of forming a chip package, comprising:
    forming a contact structure by attaching at least one continuous longitudinally extended electrically conductive element to a contact pad of a chip in at least three contact positions, wherein the conductive element bends away from the contact pad between pairs of consecutive contact positions; and
    partially encapsulating the contact structure, wherein the contact structure is partially exposed at an outer surface of the encapsulation; and
    arranging an electrically conductive material on the outer surface in contact with the exposed contact structure;
    wherein the electrically conductive material is
    a plurality of individual electrically conductive structures that are each formed on the outer surface and in contact with the exposed contact structure at one location.

2. The method of claim 1,
    wherein the contact structure comprises four or more contact positions, and wherein the exposed portions of the contact structure form a two-dimensional pattern.

3. The method of claim 1,
    wherein a two-dimensional portion of the outer surface enclosed by the exposed portions of the contact structure amounts to at least 50% of the outer surface.

4. The method of claim 1,
    wherein the encapsulation includes or consists of a platable mold compound that comprises electrically conductive particles dispersed in a dielectric base material.

5. The method of claim 1,
    wherein arranging the electrically conductive material comprises depositing a metal layer.

6. The method of any of claim 1,
wherein the contact structure comprises a bond wire or a bond ribbon.

7. The method of claim 1,
wherein the contact structure and/or the contact pad comprises copper.

8. The method of claim 1,
wherein the contact structure is a continuous structure.

9. The method of claim 1, further comprising:
fully encapsulating the contact structure and removing a portion of the encapsulation, thereby partially exposing the contact structure at the outer surface of the encapsulation.

10. The method of claim 9, further comprising:
partially removing the contact structure, thereby separating the contact structure into a plurality of individual contact segments, each of which is exposed at the outer surface.

11. The method of claim 1,
wherein the electrically conductive material is configured as a plurality of individual external contact points protruding out of the outer surface of the encapsulation.

12. The method of claim 1,
wherein the chip is configured as a power semiconductor chip, and wherein the contact pad to which the contact structure is attached is a source contact pad.

13. The method of claim 1,
further comprising removing portions of the encapsulation to expose the contact structure, thereby removing tops of the contact structure to form a plurality of segments of the contact structure,
wherein each of the electrically conductive structures are formed to be in contact with one of the segments.

14. The method of claim 1,
wherein the encapsulation comprises a laser-activatable mold compound comprising metal atoms, and
wherein arranging an electrically conductive material on the outer surface comprises activating the metal atoms by laser processing and depositing metal a region of the outer surface comprising the activated metal atoms.

15. A method of forming a chip package, comprising:
forming a contact structure by attaching at least one continuous longitudinally extended electrically conductive element to a contact pad of a chip in at least three contact positions, wherein the conductive element bends away from the contact pad between pairs of consecutive contact positions; and
partially encapsulating the contact structure, wherein the contact structure is partially exposed at an outer surface of the encapsulation; and
arranging a pre-formed electrically conductive material on the outer surface in direct physical contact with the exposed contact structure;
wherein the electrically conductive material is either one of:
a unitary electrically conductive structure that extends along the outer surface and contacts the exposed contact structure at multiple locations; or
a plurality of individual electrically conductive structures that are each formed on the outer surface and in contact with the exposed contact structure at one location.

16. The method of claim 15,
wherein the pre-formed electrically conductive material is a metal clip or plate that is disposed on the outer surface of the encapsulation.

17. The method of claim 15,
wherein the pre-formed electrically conductive material is a plurality of individual electrically conductive structures that are disposed on the outer surface of the encapsulation.

* * * * *

UNITED STATES PATENT AND TRADEMARK OFFICE
CERTIFICATE OF CORRECTION

PATENT NO. : 12,278,171 B2
APPLICATION NO. : 18/084604
DATED : April 15, 2025
INVENTOR(S) : C. Cha et al.

Page 1 of 1

It is certified that error appears in the above-identified patent and that said Letters Patent is hereby corrected as shown below:

In the Claims

Column 14, Line 3 (Claim 14) please change "metal a" to -- metal on a --

Signed and Sealed this
Fifteenth Day of July, 2025

Coke Morgan Stewart
*Acting Director of the United States Patent and Trademark Office*